United States Patent
Goto et al.

(10) Patent No.: US 7,875,199 B2
(45) Date of Patent: Jan. 25, 2011

(54) RADICAL GENERATING METHOD, ETCHING METHOD AND APPARATUS FOR USE IN THESE METHODS

(75) Inventors: Toshio Goto, Nisshin (JP); Masaru Hori, Nisshin (JP); Mikio Nagai, Komaki (JP)

(73) Assignee: Showa Denko K.K., Tokyo (JP)

( * ) Notice: Subject to any disclaimer, the term of this patent is extended or adjusted under 35 U.S.C. 154(b) by 1294 days.

(21) Appl. No.: 10/578,835

(22) PCT Filed: Nov. 9, 2004

(86) PCT No.: PCT/JP2004/016920
§ 371 (c)(1),
(2), (4) Date: May 10, 2006

(87) PCT Pub. No.: WO2005/045915
PCT Pub. Date: May 19, 2005

(65) Prior Publication Data
US 2007/0131651 A1 Jun. 14, 2007

Related U.S. Application Data
(60) Provisional application No. 60/524,613, filed on Nov. 25, 2003.

(30) Foreign Application Priority Data
Nov. 11, 2003 (JP) ............... 2003-381583

(51) Int. Cl.
C23C 14/34 (2006.01)
C23F 1/00 (2006.01)

(52) U.S. Cl. ............... 216/79; 216/67; 216/68; 204/192.32; 204/192.35; 204/192.36; 204/192.37

(58) Field of Classification Search ............... 216/59, 216/60, 61, 67, 68, 79; 204/192.3, 192.32, 204/192.33, 192.35, 192.36, 192.37, 298.31, 204/298.32, 298.34; 156/345.24, 345.25, 156/345.28, 345.38, 345.43, 345.44, 345.46, 156/345.47
See application file for complete search history.

(56) References Cited

U.S. PATENT DOCUMENTS
4,464,223 A * 8/1984 Gorin ............... 438/729
(Continued)

FOREIGN PATENT DOCUMENTS
EP 0 777 267 A1 6/1997
(Continued)

OTHER PUBLICATIONS

Koji Miyata, et al, "$CF_x(X=1-3)$ Radical Measurements in ECR Etching Plasma Employing $C_4F_8$ Gas by Infrared Diode Laser Absorption Spectroscopy", Japanese Journal of Applied Physics, Part 2 (Letters) Japan, vol. 34, No. 4A, Apr. 1, 1995, pp. L444-L447, XP002314120, ISSN: 0021-4922, abstract.

(Continued)

Primary Examiner—Rodney G McDonald
(74) Attorney, Agent, or Firm—Sughrue Mion, PLLC

(57) ABSTRACT

The method for generating radicals comprises:
feeding $F_2$ gas or a mixed gas of $F_2$ gas and an inert gas into a chamber of which the inside is provided with a carbon material,
supplying a carbon atom from the carbon material by applying a target bias voltage to the carbon material, and thereby
generating high density radicals,
wherein the ratio of $CF_3$ radical, $CF_2$ radical and CF radical is arbitrarily regulated by controlling the target bias voltage applied to the carbon material while measuring the infrared absorption spectrum of radicals generated inside the chamber.

4 Claims, 5 Drawing Sheets

U.S. PATENT DOCUMENTS

| | | | |
|---|---|---|---|
| 4,579,618 A * | 4/1986 | Celestino et al. | 156/345.44 |
| 5,272,417 A * | 12/1993 | Ohmi | 315/111.21 |
| 6,136,214 A * | 10/2000 | Mori et al. | 216/67 |
| 6,197,151 B1 | 3/2001 | Kaji et al. | |
| 6,423,242 B1 | 7/2002 | Kojima et al. | |
| 6,511,608 B1 | 1/2003 | Mori et al. | |
| 6,590,179 B2 * | 7/2003 | Tanaka et al. | 219/121.43 |

FOREIGN PATENT DOCUMENTS

| | | |
|---|---|---|
| JP | 10-242130 A | 9/1998 |
| JP | 11-145118 A | 5/1999 |
| JP | 2000-173993 A | 6/2000 |

OTHER PUBLICATIONS

Teruo Shibano, Nobuo Fujiwara, Makoto Hirayama, Hitoshi Nagata, and Kiyoshi Demizu; Etching yields of $SiO_2$ by low energy $CF_x^+$ and $F^+$ ions; Appl. Phys. Lett. 63 (17), Oct. 25, 1993, pp. 2336-2338.

* cited by examiner

RADICAL GENERATING METHOD, ETCHING METHOD AND APPARATUS FOR USE IN THESE METHODS

CROSS-REFERENCE TO RELATED APPLICATIONS

This application claims the benefit under 35 U.S.C. .sctn. 119(e) of U.S. Provisional Application No. 60/524,613 filed on Nov. 25, 2003.

FIELD OF THE INVENTION

The present invention relates to a method of generating $CF_3$ radical with high density, an etching method using the $CF_3$ radical generated by this method and an apparatus for use in these methods.

BACKGROUND OF THE INVENTION

Conventionally, in a process for semiconductor manufacturing, perfluorocarbon (PFC) gas has been used as an etching gas and a cleaning gas. However, it is considered that this PFC is one of the sources of causing global warming because this PFC has a long life in the air and a very high global warming potential. Therefore, the development of alternative gases and the development of a new etching system have been desired.

When the PFC gas is plasmanized, plural kinds of radicals such as CF radical, $CF_2$ radical and $CF_3$ radical are present in this plasma. Of these radicals, it is known that $CF_3$ radical can attain a higher etching rate in a plasma etching process of a silicon oxide film ($SiO_2$) as compared with other radicals (referred to a nonpatent literature 1). On this account, it is an important object to generate $CF_3$ radical selectively from the viewpoint of the efficiency of the etching process. Further, conventional plasma etching processes have a problem such that an etching substrate consisting essentially of $SiO_2$ and a resist has low etching selectivity to a $SiO_2$ film. Therefore, the development of a plasma etching process having high etching selectivity to the $SiO_2$ film has also been desired.

However, in the conventional plasma etching processes using PFC gas, it is difficult to generate a specific radical selectively, and further it is impossible to improve the etching selectivity to the $SiO_2$ film. Under the circumstances, the development on a new radical generating method for generating $CF_3$ radical selectively and etching system using this method has been desired.

Patent literature 1 discloses an etching method and an etching apparatus using a carbon material as an upper electrode (application electrode). The etching method comprises etching an AlCu alloy film using chlorine radical as an etching source. The carbon species generated from the carbon material by applying a high frequency voltage to an application electrode are used to scavenge excess amount of chlorine radical (etching species) present in TiN/Ti etching after the completion of etching the AlCu alloy film. That is, Patent document 1 fails to disclose and suggest generation of an etching species such as $CF_3$ radical using a carbon species generated from the carbon material. Further, the document fails to disclose that a specific radical can be selectively generated by regulating the voltage applied to an application electrode.

Patent document 1: JP-A-11(1999)-145118

Nonpatent literature 1: T. Shibano, N. Fujiwara, M. Hirayama, H. Nagata and K. Demizu, Appl. Phys. Lett. 63, 2336 (1993)

OBJECT OF THE INVENTION

The present invention is intended to solve the problems associated with the above prior arts, and it is an object of the invention to provide a method for generating radicals by which $CF_3$ radical and the like can be generated without using gases having a high global warming potential, such as PFC, and by which a specific radical can be selectively generated, and to provide an etching method using the radical generating method, and it is another object of the invention to provide a radical generating apparatus.

The present invention is another object of the invention to provide a method for selectively etching a silicon oxide film when a film consisting essentially of a silicon oxide film and a resist is etched.

SUMMARY OF THE INVENTION

The present inventors have been earnestly studied in order to solve the above problems and found that fluorine and carbon species are independently supplied and a target bias voltage, which is applied to a carbon material, such as graphite, as resources of carbon species, is controlled and thereby high purity $CF_3$ radical is generated with high density, and further radicals containing $CF_3$ radical, $CF_2$ radical and CF radical in an arbitrary ratio can be generated, and that a silicon oxide film is selectively etched by feeding a gas having a low fluorine concentration. Thus, the present invention has been accomplished.

Namely, the present invention relates to the following properties (1) to (12).

(1) A method for generating radicals comprising:
feeding $F_2$ gas or a mixed gas of $F_2$ gas and an inert gas into a chamber of which the inside is provided with a carbon material,
supplying a carbon atom from the carbon material by applying a target bias voltage to the carbon material, and
thereby generating high density radicals,
wherein the bias voltage of not more than 600 V is applied to the carbon material to selectively form $CF_3$ radical and thereby high purity $CF_3$ radical is generated.

(2) The method for generating radicals according to the property (1), wherein the carbon atom is generated by magnetron sputtering of the carbon material.

(3) The method for generating radicals according to the property (1) or (2), wherein the target bias voltage is applied to the carbon material by a dual frequency combined magnetron in which a high frequency power source and a low frequency power source are connected in parallel.

(4) The method for generating radicals according to any one of the properties (1) to (3), wherein the target bias voltage is from 480 to 600 V.

(5) A method for generating radicals comprising:
feeding $F_2$ gas or a mixed gas of $F_2$ gas and an inert gas into a chamber of which the inside is provided with a carbon material,
supplying a carbon atom from the carbon material by applying a target bias voltage to the carbon material, and thereby
generating high density radicals,
wherein the ratio of $CF_3$ radical, $CF_2$ radical and CF radical is arbitrarily regulated by controlling the target bias voltage applied to the carbon material while measuring the infrared absorption spectrum of radicals generated inside the chamber.

(6) The method for generating radicals according to the property (5), wherein the carbon atom is generated by magnetron sputtering of the carbon material.

(7) The process for generating radicals according to the property (5) or (6), wherein the target bias voltage is applied to the carbon material by a dual frequency combined magnetron in which a high frequency power source and a low frequency power source are connected in parallel, and is regulated by controlling the output of the low frequency power source.

(8) A method for etching a silicon oxide film comprising: etching a silicon oxide film using high purity $CF_3$ radical generated by the method for generating radicals according to any one of the properties (1) to (4).

(9) The method for etching comprising:
etching a film consisting essentially of a silicon oxide film and a resist using radicals containing $CF_3$ radical and $CF_2$ radical generated by the method for generating radicals according to any one of the properties (5) to (7), wherein the ratio of the density of $CF_3$ radical to the density of $CF_2$ radical ($CF_3/CF_2$) is not more than 10.

(10) A radical generating apparatus comprising a chamber in which an application electrode and a counter electrode are installed, and a means for feeding $F_2$ gas or a mixed gas of $F_2$ gas and an inert gas into the chamber,
wherein the application electrode comprises a carbon material and is connected with a dual frequency combined magnetron in which a high frequency power source and a low frequency power source are connected in parallel, and the chamber is connected with an infrared absorption spectrometer so that IR laser irradiated from the infrared absorption spectrometer passes through between the application electrode and the counter electrode.

(11) An etching apparatus comprising a chamber in which an application electrode and an electrode for mounting a substrate are installed, and a means for feeding $F_2$ gas or a mixed gas of $F_2$ gas and an inert gas into the chamber, wherein the application electrode comprises a carbon material and is connected with a dual frequency combined magnetron in which a high frequency power source and a low frequency power source are connected in parallel, an etching substrate can be mounted on the electrode for mounting a substrate and the chamber is connected with an infrared absorption spectrometer so that IR laser irradiated from the infrared absorption spectrometer passes through between the application electrode and the electrode for mounting a substrate.

(12) A method for etching comprising:
feeding a mixed gas of $F_2$ gas and an inert gas into a chamber of which the inside is provided with a carbon material,
supplying a carbon atom from the carbon material by applying a target bias voltage to the carbon material, and thereby
generating radicals containing $CF_3$ radical and $CF_2$ radical, and
etching a film consisting essentially of a silicon oxide film and a resist by using the radicals,
wherein $F_2$ gas concentration in the mixed gas is from 0.1 to 4.0% by volume.

EFFECT OF THE INVENTION

According to the present invention, $CF_3$ radical can be generated without using a greenhouse effect gas such as PFC gas and further this $CF_3$ radical can be generated with high density and high purity. Furthermore, using an etching gas containing $CF_3$ radical with high density and high purity, it is possible to improve the etching rate of a silicon oxide film ($SiO_2$ film) and also to improve the efficiency of plasma etching process.

Moreover, according to the present invention, it is possible to arbitrarily regulate the ratio of $CF_3$ radical, $CF_2$ radical and CF radical generated. Using a high density radical containing $CF_3$ radical, $CF_2$ radical and CF radical in a specific ratio as an etching gas, it is possible to improve the selectivity of $SiO_2$ etching.

Furthermore, feeding a gas having a low fluorine concentration, it is possible to greatly improve the selectivity of $SiO_2$ etching and also to carry out a plasma etching with high accuracy.

DESCRIPTION OF SYMBOLS

Figure 1:
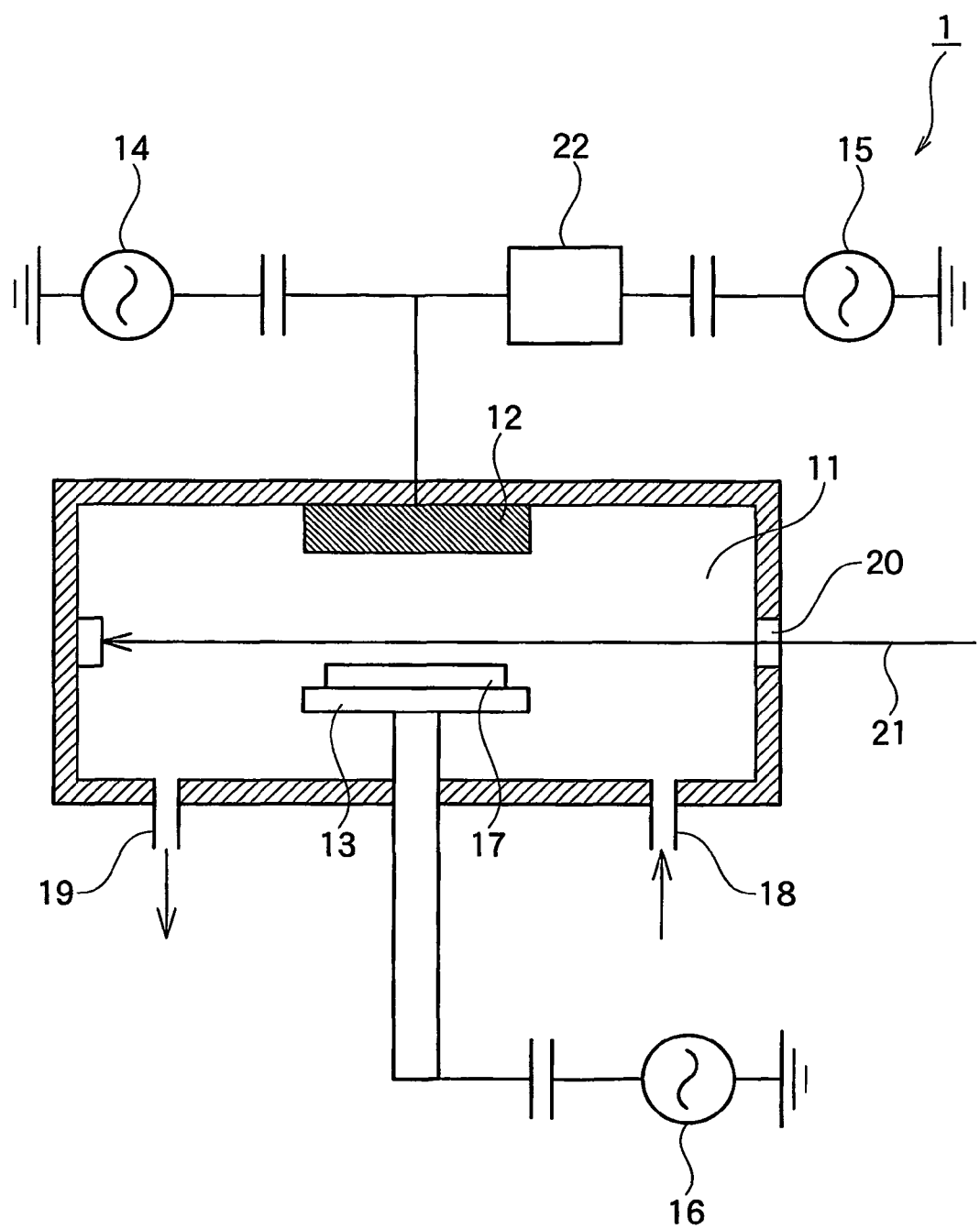
FIG. 1 is a sectional drawing of an etching apparatus according to the present invention.

1 Etching apparatus
11 Chamber
12 Application electrode (carbon material)
13 Electrode for mounting a substrate
14 High frequency power source for application electrode
15 Low frequency power source
16 High frequency power source for mounting a substrate
17 Etching substrate
18 Gas feeding opening
19 Gas exhaust
20 Window for measuring infrared absorption spectrum
21 IR laser
22 Low pass filter

PREFERRED EMBODIMENTS OF THE INVENTION

The radical generating method and the etching method according to the present invention will be described with reference to an etching apparatus as shown in FIG. 1, but the present invention should not be limited thereby. The etching apparatus may be a plasma generating apparatus (etching apparatus), which comprises a chamber provided with a carbon material inside thereof, a means of feeding or generating $F_2$ gas or a mixed gas of $F_2$ and an inert gas into the chamber, and a means for controlling a target bias voltage applied to the carbon material.

At first, the apparatus used for the radical generating method and the etching method of the present invention is described. FIG. 1 is a sectional drawing of the etching apparatus capable of generating radicals by the radical generating method of the present invention. The etching apparatus 1 has parallel-plate electrodes, which comprise an application electrode 12 and an electrode 13 for mounting a substrate, inside a chamber 11. The application electrode 12 is an electrode made from a carbon material. It is preferred to use graphite as a carbon material. This application electrode 12 is connected with a dual frequency combined magnetron in which a high frequency power source 14 and a low frequency power source 15 are connected in parallel. To the application electrode 12, two kinds of the frequencies of the high frequency (13.56 MHz) and the low frequency (450 kHz) are supplied from this dual frequency combined magnetron. On the electrode 13 for mounting a substrate, an etching substrate 17 can be mounted and a bias voltage of 2 MHz can be applied thereto. In the present specification, the electrode 13 for mounting a substrate is sometimes referred to a "counter electrode" simply.

Figure 2:
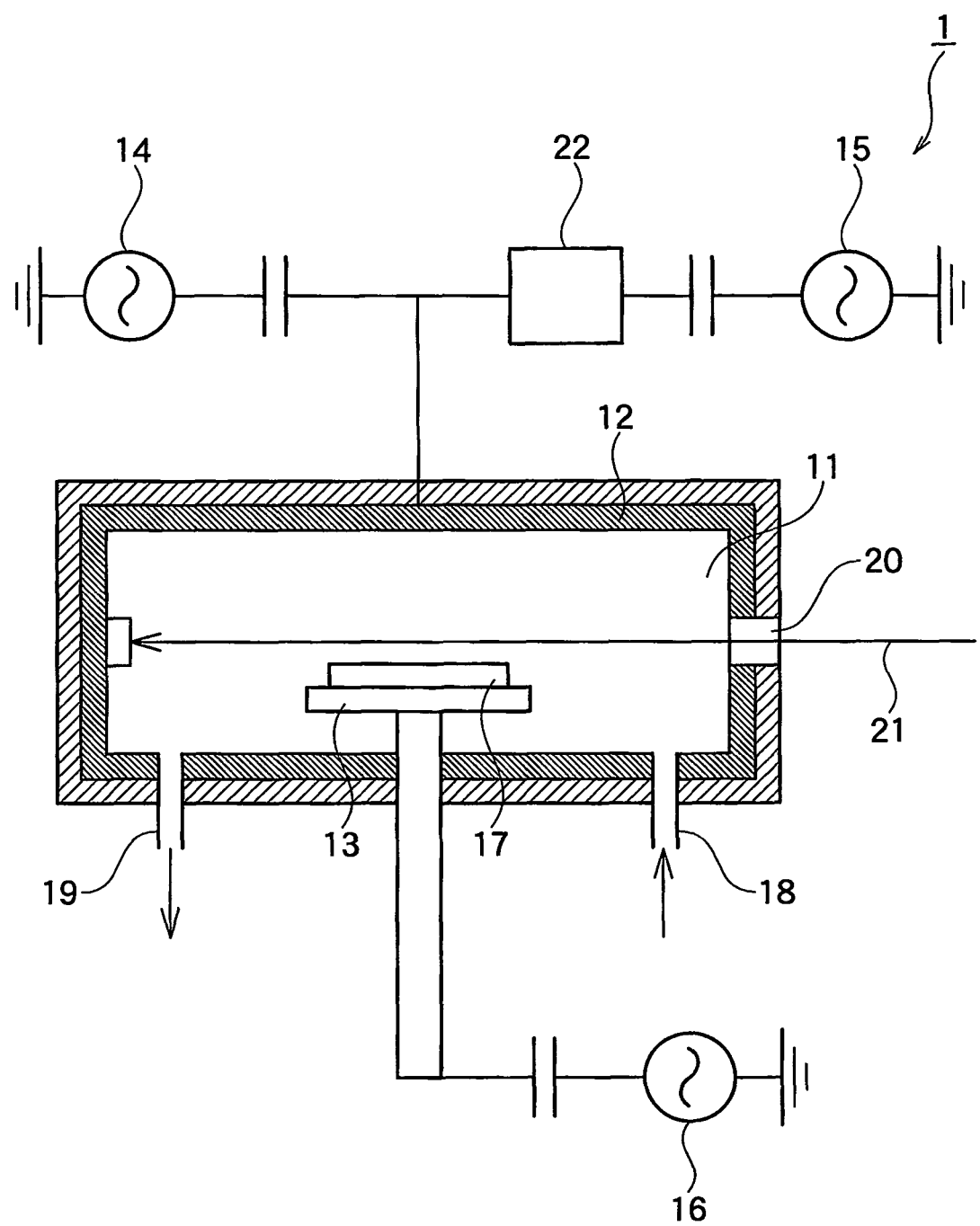
FIG. 2 is a sectional drawing of an etching apparatus according to the present invention.

The radical generating apparatus and the etching apparatus according to the present invention are not limited by the apparatus installing the parallel-plate electrodes, as shown in FIG. 1, and for example, may be an apparatus such that an application electrode 12 made of a carbon material is provided on the inside wall of a chamber 11 and an electrode 13 for mounting a substrate is provided inside the chamber, as shown in FIG. 2.

The chamber 11 has a gas feeding opening 18 for introducing $F_2$ gas and the like, a gas exhaust 19 for discharging an exhaust gas generated after etching and a window 20 for measuring infrared absorption spectra. The chamber 11 is connected with an infrared absorption spectrometer so as to measure the infrared absorption spectrum of radical species present in the chamber. Specifically, the chamber 11 and the infrared absorption spectrometer are connected with each other so that IR laser irradiated from this infrared absorption spectrometer enters into the inside of the chamber 11 from the window 20, passes through between the application electrode 12 and the electrode 13 for mounting a substrate, and then is detected by a detector.

In next place, the radical generating method and the etching method according to the present invention are described.

To the chamber 11 in which the pressure is reduced, $F_2$ gas or a mixed gas containing $F_2$ gas is fed as a supply source of fluorine atom. At this time, the pressure in the chamber is preferably from $10^{-4}$ to $10^2$ Pa. It is preferred as $F_2$ gas to use $F_2$ gas generated by heating a solid source such as $K_3NiF_7$ and $CoF_3$ although a commercially available fluorine gas compressed in a gas cylinder can be used. Using a commercially fluorine gas, it is difficult to prepare 100% $F_2$ gas from the viewpoint of safety. On the other hand, using the solid source as a resource of $F_2$ gas, it is possible to prepare 100% $F_2$ gas. Furthermore, mixing this 100% $F_2$ gas with an inert gas such as argon, it is possible to properly prepare a $F_2$ mixed gas having an arbitrary concentration. The $F_2$ gas concentration in the mixed gas is preferably from 0.1 to 50% by volume.

Next, a high frequency voltage (13.56 MHz) is applied to the application electrode 12 comprising the carbon material, to generate high density plasma inside the chamber. It is possible to properly regulate the electron density by controlling the output power of the applied high frequency. The carbon species are supplied by magnetron sputtering of the carbon material in this plasma.

Furthermore, a low frequency voltage (450 kHz) is also applied to the application electrode 12 (carbon material) by means of the dual frequency combined magnetron, to regulate the target bias voltage of the application electrode 12. The regulation of the target bias voltage can control the energy of ions incident into the application electrode 12. In a first radical generating method according to the present invention, the target bias voltage is regulated to be not more than 600 V, preferably from 480 to 600 V. As a result, it is possible to generate $CF_3$ radical selectively and prepare $CF_3$ radical with high density and high purity. Specifically, it is possible to prepare $CF_3$ radical with a density of not less than $4\times10^{12}$ $cm^{-3}$ and a purity of not less than 85%. The radical density is determined by an infrared absorption spectroscopy.

A second radical generating method according to the present invention is such a process that the target bias voltage is properly regulated to generate radials containing $CF_3$ radical, $CF_2$ radical and CF radical in an arbitrary ratio. Specifically, the radical density inside the chamber is measured by the infrared absorption spectroscopy. Based on the radical density measured, the target bias voltage applied to the carbon material (application electrode 12) is regulated by controlling the output power of a low frequency to regulate the ratio of $CF_3$ radical, $CF_2$ radical and CF radical. The measurement of the radical density is carried out by measuring infrared absorption spectrum of radical species present inside the chamber with irradiation of IR laser 21 (infrared laser) from the window 20 of the chamber 11 using the infrared absorption spectrometer. From the obtained infrared absorption spectrum, the densities of $CF_3$ radical (1262.10 $cm^{-1}$), $CF_2$ radical (1132.75 $cm^{-1}$) and CF radical (1308.49 $cm^{-1}$ and 1308.50 $cm^{-1}$) present in the chamber are determined.

According to the second radical generating process of the present invention, it is possible to arbitrarily control the target bias voltage applied to the application electrode 12, and also the densities of $CF_3$ radical, $CF_2$ radical and CF radical present in the chamber are measured at any time to determine the ratio thereof. Furthermore, it is possible to generate radicals containing $CF_3$ radical, $CF_2$ radical and CF radical in an arbitrary ratio.

A first etching method of the present invention is a method for etching an etching substrate having a silicon oxide film ($SiO_2$ film) using high purity $CF_3$ radical generated by the first radical generation method. An etching substrate 17 is mounted in the electrode 13 for mounting a substrate, a high frequency voltage of 2 MHz is applied to the electrode 13 for mounting a substrate using the high frequency power source 16 and thereby the bias voltage of the substrate is regulated to be 0 V. In this state, the $SiO_2$ film is etched by generating high density radicals with high purity in the chamber with the above first radical generating method.

Using high purity $CF_3$ radical generated by the first radical generating method as described above, for example, $CF_3$ radical having a purity of not less than 85%, the etching rate of $SiO_2$ can be enhanced.

A second etching method of the present invention is a method for etching a film consisting essentially of a $SiO_2$ film and a resist by using radicals obtained with increasing the target bias voltage applied to the application electrode 12 in the second radical generating method and having a density ratio of $CF_3$ radical to $CF_2$ radical of not more than 10. For example, a substrate having a film ($SiO_2$/resist film) consisting essentially of $SiO_2$ film and a resist is mounted as the etching substrate 17 on the electrode 13 for mounting a substrate, high frequency voltage of 2 MHz is applied to the electrode 13 for mounting a substrate using the high frequency power source 16 and thereby the bias voltage of the substrate is regulated to be 0 V. In this state, the target bias voltage applied to the application electrode 12 is increased in the above second radical generating method and thereby radicals containing $CF_3$ radical with high density and having a density ratio of $CF_3$ radical to $CF_2$ radical of not more than 10 are generated. When the $SiO_2$/resist film is etched using such radicals, the $SiO_2$ etching rate is increased but the resist etching rate is decreased. As a result, the $SiO_2$ etching selectivity is improved in etching the $SiO_2$/resist film.

The target bias voltage applied the application electrode 12 is usually not less than 700 V, preferably not less than 800 V, more preferably not less than 900 V. When the target bias voltage is set to be in the above range, particularly not less than 900 V, the density ratio of $CF_3$ radical to $CF_2$ radical is generally not more than 10, preferably not more than 5, more preferably not more than 3, and thereby the $SiO_2$ etching selectivity is improved in etching the $SiO_2$/resist film. As described above, when the $SiO_2$ etching selectivity is improved, the perpendicular processing of a contact hole can be carried out in the substrate having the $SiO_2$/resist film.

A third etching method of the present invention is a method for etching a film consisting essentially of a $SiO_2$ film and a resist by feeding a mixed gas containing $F_2$ gas at the low $F_2$ concentration. For example, a substrate having a film ($SiO_2$/resist film) consisting essentially of $SiO_2$ film and a resist is mounted as the etching substrate 17 on the electrode 13 for mounting a substrate, and the mixed gas containing $F_2$ gas, preferably a mixed gas of $F_2$ gas and an inert gas is fed into the chamber 11 under conditions of a $F_2$ gas concentration from 0.1 to 4% by volume, preferably 1.0 to 3.5% by volume.

Next, high frequency voltage of 2 MHz is applied to the electrode 13 for mounting a substrate using the high frequency power source 16 and thereby the bias voltage of the substrate is regulated to be not more than 0 V. In this state, a low frequency voltage and a high frequency voltage are applied to the application electrode 12 and a given target bias voltage is applied by controlling the output power of a low frequency, whereby radicals containing $CF_3$ radical and $CF_2$ radical are generated. The target bias voltage applied the application electrode 12 should not be limited, but the target bias voltage is preferably not less than 480 V, more preferably not less than 700 V. When the target bias voltage is set to be in the above range, particularly not less than 900 V, the radicals with high density can be prepared.

When the $SiO_2$/resist film is etched using radicals generated by feeding the mixed gas containing $F_2$ gas at a low $F_2$ concentration as described above, the $SiO_2$ film can be selectively etched in etching the $SiO_2$/resist film. In particular, when the $F_2$ gas concentration is in the above range, a $SiO_2$/resist selectivity can be not less than 20. If the $F_2$ gas concentration is less than 0.1% by volume, an etching rate of $SiO_2$ is significantly decreased. If the $F_2$ gas concentration is more than 4.0% by volume, an etching rate of $SiO_2$ is increased whereas the high $SiO_2$/resist selectivity cannot be obtained.

In a plasma etching of the substrate having the $SiO_2$/resist film, by greatly improving the $SiO_2$ etching selectivity, the perpendicular processing of a contact hole can be carried out.

Hereinafter, the present invention will be described in detail with reference to the following examples, but the present invention should not be limited by the examples.

EXAMPLES

Example 1

Figure 3:
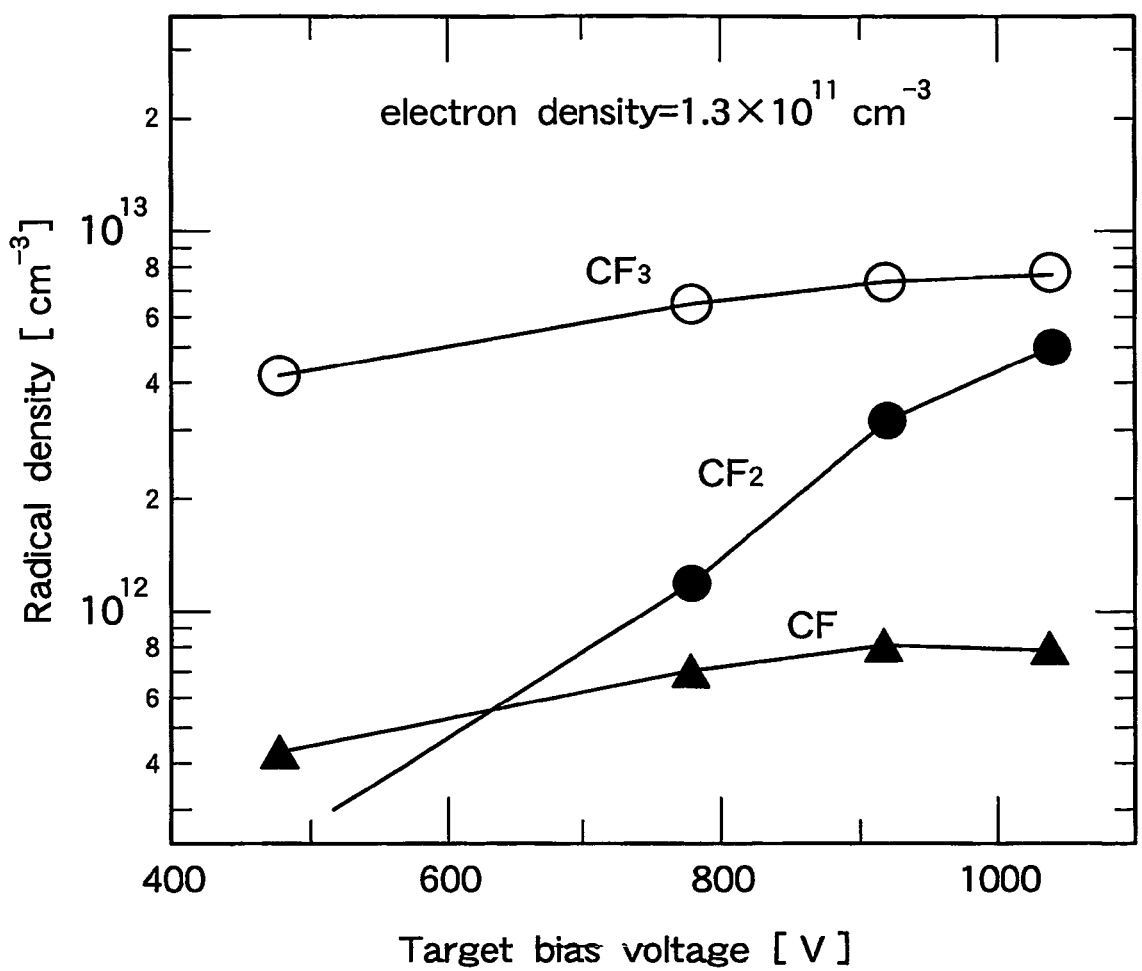
FIG. 3 is a graph showing a relationship between the densities of radicals generated and the target bias voltage applied to a carbon material.
Figure 4:
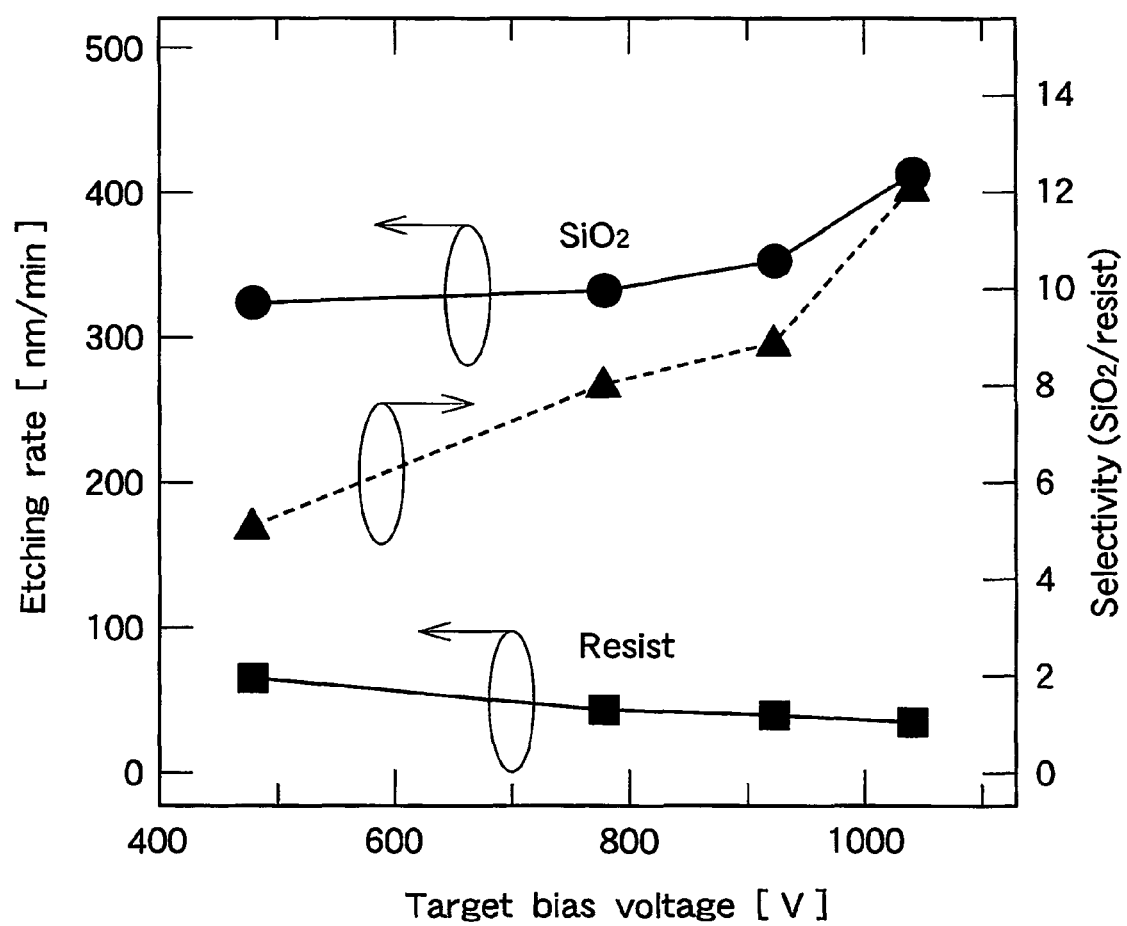
FIG. 4 is a graph showing a relationship of the etching rates and the $SiO_2$ selectivity in a $SiO_2$/resist film to the target bias voltage applied to a carbon material.

In accordance with the above method using the etching apparatus as shown in FIG. 1, radicals were generated in the following conditions and etching on a 0.6 μm contact hole in an etching substrate having a $SiO_2$/resist film was carried out. The results are shown in FIGS. 3 and 4.
Feed source of fluorine: Mixed gas of $F_2$/Ar=5/95 sccm
Application electrode: Graphite electrode
Lower electrode: Stainless-steel (SUS) electrode
High frequency power source: Frequency 13.56 MHz, Output 1500 W
Low frequency power source: Frequency 450 kHz, Output 0 to 550 W
Inner pressure of chamber: 4 Pa
Electron density: $1.3 \times 10^{11}$ $cm^{-3}$
Lower electrode power source: Frequency 2 MHz
Substrate bias voltage: 0 V (Method For Measuring Radical Density)

The inside of the chamber was irradiated with IR laser, and the density of each of $CF_3$ radical (1262.10 $cm^{-1}$), $CF_2$ radical (1132.75 $cm^{-1}$) and CF radical (1308.49 $cm^{-1}$ and 1308.50 $cm^{-1}$) present in the chamber was measured by the infrared absorption spectrum of each radical.

(Method Of Measuring Etching Rate)

A $SiO_2$ film was etched using a resist as a mask, and thereafter the resulting substrate was observed by a scanning electron microscope (SEM), the thickness of each of the resist and the $SiO_2$ film was measured and the etching rate thereof was determined.

As seen in FIG. 3, $CF_3$ radical could be generated with high density (not less than $4 \times 10^{12}$ $cm^{-3}$) and high purity (not less than 85%) by regulating the target bias voltage applied to the application electrode to not more than 600 V. Furthermore, it was confirmed that the target bias voltage applied to the application electrode is arbitrary regulated while the infrared absorption spectra of radicals present inside the chamber are measured, and thereby the density of $CF_2$ radical present inside the chamber can be changed and also the ratio of $CF_3$ radical, $CF_2$ radical and CF radical can be regulated.

As seen in FIG. 4, with the increase of the target bias voltage applied on the application electrode, the etching rate of the $SiO_2$ film was increased, but the etching rate of the resist film was decreased. As a result, it was confirmed that the $SiO_2$ etching selectivity in the $SiO_2$/resist film could be improved by increasing the target bias voltage applied to the upper electrode.

Example 2

Figure 5:
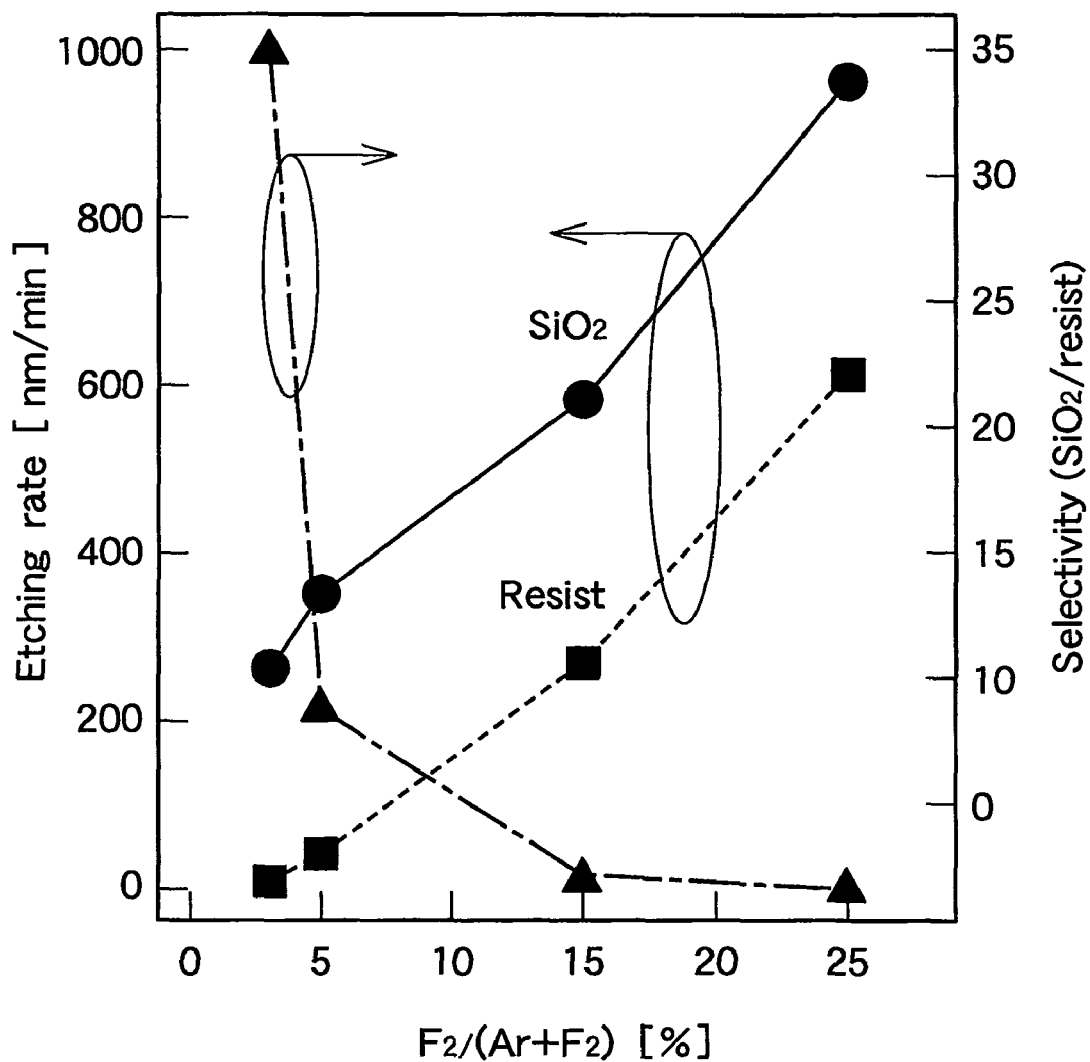
FIG. 5 is a graph showing a relationship of the $SiO_2$ selectivity in a $SiO_2$/resist film to the fluorine gas concentration in the mixed gas fed into the chamber.

In accordance with the above method using the etching apparatus as shown in FIG. 1, radicals were generated in the following conditions and etching on a 0.6 μm contact hole in an etching substrate having a $SiO_2$/resist film was carried out. The etching rate was measured in the same manner as in Example 1. The results are shown in FIG. 5.
Feed source of fluorine: Mixed gas of $F_2$/Ar=3/97 to 25/75 sccm
Flow rate of the mixed gas: 100 sccm
Application electrode: Graphite electrode
Lower electrode: Stainless-steel (SUS) electrode
Inner pressure of chamber: 4 Pa
High frequency power source: Frequency 13.56 MHz, Output 1500 W
Low frequency power source: Frequency 450 kHz, Output 0 to 550 W
Electron density: $1.3 \times 10^{12}$ $cm^{-3}$
Lower electrode power source: Frequency 2 MHz
Substrate bias voltage: −400 V
Target bias voltage to application electrode: 920 V As seen in FIG. 5, with the decrease of the fluorine concentration in the mixed gas fed to the chamber, the $SiO_2$ etching selectivity in the $SiO_2$/resist film was improved. When the fluorine concentration was less than 5.0% by volume, the $SiO_2$/resist selectivity was remarkably increased. More specifically, the $SiO_2$/resist selectivity was 35 at a $F_2$/(Ar+$F_2$) of 3% by volume.

INDUSTRIAL APPLICABILITY

According to the present invention, the etching rate of the $SiO_2$ film can be increased by selectively generating $CF_3$ radical and thereby the production efficiency of a semiconductor device can be enhanced. Furthermore, the $SiO_2$ etching selectivity in the $SiO_2$/resist film can be improved by changing the density ratio of $CF_3$ radical and $CF_2$ radical, and thereby a semiconductor device can be manufactured with high accuracy.

Further, the $SiO_2$ etching selectivity in the $SiO_2$/resist film can be improved by using the mixed gas containing fluorine at a low fluorine concentration, and thereby a semiconductor device can be manufactured with high accuracy.

The invention claimed is:

1. A method for generating radicals comprising:
   feeding $F_2$ gas or a mixed gas of $F_2$ gas and an inert gas into a chamber of which the inside is provided with a carbon material,
   supplying a carbon atom from the carbon material by applying a target bias voltage to the carbon material, and thereby generating radicals,
   wherein the bias voltage of 480 to 600 V is applied to the carbon material to selectively form $CF_3$ radical and thereby $CF_3$ radical is generated.

2. The method for generating radicals according to claim 1, wherein the carbon atom is generated by magnetron sputtering of the carbon material.

3. The method for generating radicals according to claim 1, wherein the target bias voltage is applied to the carbon material by a dual frequency combined magnetron in which a high frequency power source and a low frequency power source are connected in parallel.

4. A method for etching a silicon oxide film comprising:
   etching a silicon oxide film using $CF_3$ radical generated by the method for generating radicals according to claim 1.

* * * * *